United States Patent
Yang

[11] Patent Number: 6,037,231
[45] Date of Patent: Mar. 14, 2000

[54] METHOD FOR FORMING A MOS STRUCTURE HAVING SIDEWALL SOURCE/DRAIN AND EMBEDDED GATE

[75] Inventor: Yu-Hao Yang, Hsinchu, Taiwan

[73] Assignee: Winbond Electronics Corporation, Hsinchu, Taiwan

[21] Appl. No.: 08/975,866

[22] Filed: Nov. 21, 1997

[51] Int. Cl.⁷ .................................................. H01L 21/336
[52] U.S. Cl. .......................... 438/299; 438/302; 438/525
[58] Field of Search ..................................... 438/302, 525, 438/524, 301, 270, 299, 197, 282

[56] References Cited

U.S. PATENT DOCUMENTS 5,498,564  3/1996  Geissler et al. ............................ 438/52
5,578,508  11/1996  Baba et al. ................................. 438/35

*Primary Examiner*—Tuan H. Nguyen
*Attorney, Agent, or Firm*—Proskauer Rose LLP

[57] ABSTRACT

A MOS device is provided with a reduced source and drain area. This is accomplished by first providing a MOS device with a buried gate region. The buried gate region is located on top of a channel region, which runs horizontally along the bottom of the gate trench. The source and drain regions are aligned vertically an parallel to the outside sidewalls of the buried gate region. Sidewall protectors are provided between the gate and lateral source and drain regions on the inside sidewalls of the gate trench. Additionally, a process for manufacturing the above described device is also disclosed.

18 Claims, 4 Drawing Sheets

METHOD FOR FORMING A MOS STRUCTURE HAVING SIDEWALL SOURCE/DRAIN AND EMBEDDED GATE

FIELD OF THE INVENTION

The present invention relates to a Metal Oxide Semiconductor (MOS) device. More specifically, the present invention relates to a MOS device with a sidewall source and drain, and an embedded gate.

BACKGROUND OF THE INVENTION

As demands for greater circuit integration have increased, it has become more desirable to decrease the overall area occupied by a semiconductor device. For example, by decreasing the area that a MOS device occupies, the packing density (or number of devices per unit substrate) of the integrated circuit can be increased, thus substantially decreasing chip manufacturing costs.

One significant problem that has been encountered in decreasing the area of a MOS device has been decreasing the area occupied by the source and drain. For example, a conventional MOS device 10 is shown in FIG. 1. An oxide film 15 and a polysilicon film 16 are formed over a P-type semiconductor substrate 20. These films are then patterned to form a gate oxide film 15 and gate 16. Using the gate 16 as a mask, n type impurity ions are implanted in a low concentration in the substrate to form Lightly Doped source/drain (LDD) regions 13. An oxide film is then deposited over the entire exposed surface of the substrate 20 and then subjected to an anisotropic etching to form side wall spacers 17. Finally, n type impurity ions are implanted in a high concentration in the substrate 20 using the side wall spacers 17 as a mask, thereby forming a high concentration source/drain region 14. A channel 19 is defined between the conductivity areas 13, 14 beneath the gate 16.

The isolation space in a semiconductor is the space between adjacent semiconductor devices on the same substrate. Adjacent devices on a substrate are usually separated by a field oxide (FOX) insulator 18. With smaller source/drain regions, adjacent devices may be placed closer together, thus increasing packing density. In order to reduce the overall area occupied by the typical NMOS device of FIG. 1, it would be advantageous to reduce both the source/drain isolation space and the source/drain area.

However, there are several significant limitations to how small the source and drain can be made. Simply reducing the size of the source/drain regions cannot be accomplished while using the MOS fabrication process discussed above. For example, when forming the gate, the gate should be properly aligned between the source and drain regions. If the gate does not extend to the source and drain regions, an incomplete channel will be formed and the device will not work. One method of overcoming this is to form the gate such that it overlaps the source and drain. This overlap should be sufficient to allow for mask registration tolerances and variation in lateral diffusion in the source and drain diffusion step. However, due to this overlap, a stray parasitic capacitance may develop between the gate and source and the gate and drain. To avoid this, the gate may be self-aligned. One method of accomplishing self-alignment is to use ion implantation or diffusion to align the source and drain with the edges of the gate. In this process, the gate and sidewalls are used as a mask for the Lightly Doped Drain (LDD). Subsequently, windows in the photoresist layer are opened with a stepper device. Ions are then diffused or implanted through these windows.

Several factors in this process limit the extent to which the dimensions of the heavily doped source and drains can be reduced. Foremost, the source and drain are limited to be at least on the order of the resolution of the stepper device used to open the windows in the photoresist. Therefore, even if the isolation space for the source/drain regions could be reduced, the width of the source/drain itself cannot be reduced further. Because this is a substantial limitation on the ultimate reduction of the size of the chip, a need exists for a process for reducing the overall area occupied by the source/drain regions, and/or for reducing the isolation space required by the source/drain regions.

OBJECTS OF THE INVENTION

Accordingly, it is an object of the invention to provide a MOS device wherein the source and drain regions occupy a reduced area.

It is a further object to provide a MOS device wherein the gate region is buried in a trench of the substrate.

It is another object of the invention to provide a MOS device wherein the source and drain regions are oriented vertically on and parallel to the sidewall of the buried gate.

It is a further object of the invention to provide a MOS device wherein the buried gate region is substantially flush with the surface of the substrate.

SUMMARY OF THE INVENTION

These and other objects are achieved by the present invention. According to a preferred embodiment of the present invention, a MOS device is provided that has a reduced source and drain area, and an embedded gate. This results in a reduced MOS device size and in a greater packing density. This is accomplished by first providing a MOS device with a buried gate region. The buried gate region is located on top of a channel region, which runs horizontally along the bottom of the gate trench. The source and drain regions are aligned vertically and parallel to the outside sidewalls of the buried gate region. Sidewall protectors are provided between the gate and lateral source and drain regions on the inside sidewalls of the gate trench.

A preferred method of fabricating the above MOS device includes the following steps. Using a photoresist technique, a trench for the buried gate is etched in the substrate. A thin gate oxide is then grown over the bottom and sidewalls of the etched trench. This thin gate oxide at the bottom of the trench defines the channel region. A thin polysilicon ("poly") material is then deposited on the substrate, and then etched back so that only the bottom of the trench is covered. This poly material protects the gate area during subsequent steps. Next, the source and drain regions are formed by implanting low energy ions in the sidewalls of the trench. These ions are implanted at an angle with respect to the sidewalls.

Next, a sidewall layer such as an oxide or a nitride is then deposited. Subsequently, the oxide or nitride layer is anisotropically etched back to form an isolation layer on the sidewalls of the trench. These sidewall isolation layers provide insulation between the gate and source/drain regions. Finally, a gate material such as poly is deposited in the trench, and etched back until it is substantially flush with the surface of the chip.

This inventive device and process solves the above mentioned problems within the prior art. The method allows the source and drain regions to be formed at a substantially smaller horizontal cross section than the prior art. Because a photoresist etching technique is not used, the size of the source and drain areas are not limited to the resolution of the photoresist etching technique. Moreover, due to the method by which the ions are implanted in the sidewall of the gate trench, an ion concentration gradient is inherently achieved. This obviates the need for a separate step to form a LDD. Accordingly, a smaller isolation space and thus a tighter packing density is achieved through a smaller source and drain, using fewer manufacturing steps.

DETAILED DESCRIPTION OF THE INVENTION

Figure 1:
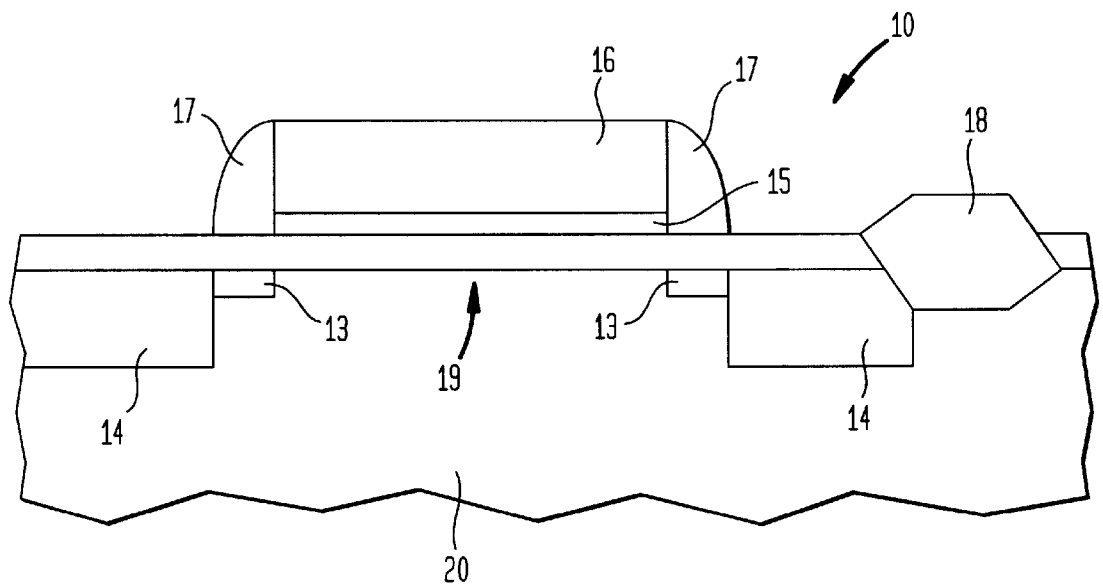
FIG. 1 is a cross-sectional view of a prior art NMOS device.
Figure 2:
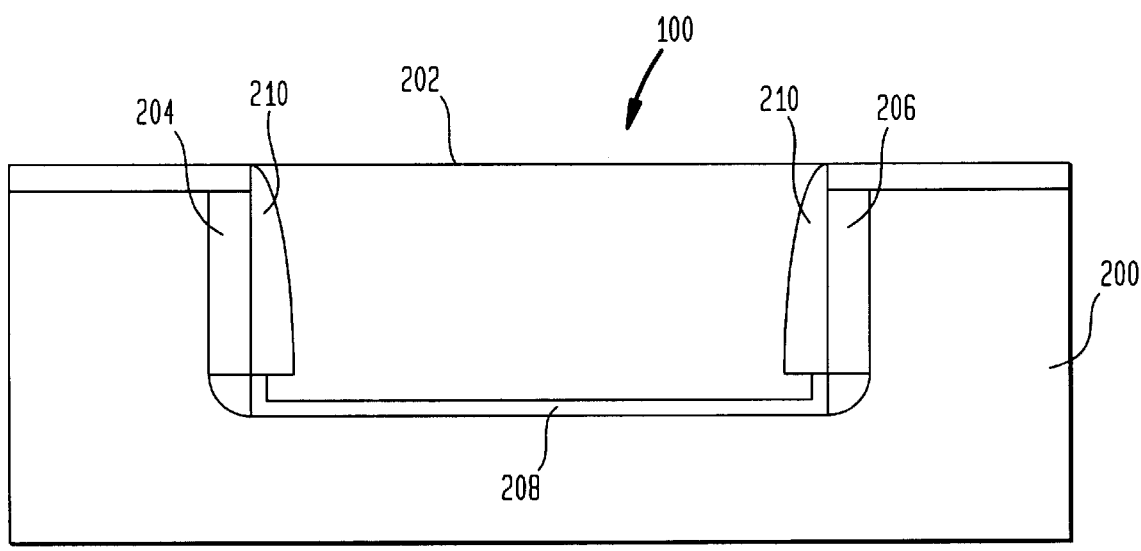
FIG. 2 is a cross-sectional view of the present invention.

FIG. 2 shows a cross sectional view of the MOS device 100 of the present invention. The substrate 200 of the MOS device has a first conductivity type and a buried gate 202, also having the first conductivity type. This buried gate 202 is substantially flush to the top of the substrate 200. The source 204 and drain 206 regions have a second conductivity type opposite the first conductivity type, and are oriented vertically, and disposed parallel to the sidewalls of the buried gate region 202. A gate channel 208 is horizontally disposed beneath the gate 202. The gate 202 is insulated from the channel 208 and source 204 and drain regions 206 by sidewall insulators 210.

This inventive structure has several advantages over the MOS devices of the prior art. First, because the gate region is buried and flush to the top of the substrate, the MOS device is planar. This is advantageous because, due to the planarized silicon surface, the planarization process prior to the metal interconnection step may be omitted, resulting in fewer processing steps. Moreover, since the contact height to the source/drain region and the gate region is the same, the damage to the gate region during the etch process is reduced, and contact resolution is improved.

Second, the vertical sidewall source and drain regions have a smaller horizontal cross sectional area than MOS devices of the prior art. This allows a greatly reduced isolation space between adjacent devices, and provides for greater packing densities.

Third, by implanting the source and drain regions in the sidewalls of the gate, the gate is inherently self-aligned. Moreover, due to the vertical implantation process of the source and drain regions, separate steps for creating a LDD are unnecessary. In short, a MOS device is provided having smaller dimensions, and which may be fabricated with fewer manufacturing steps, than previously possible.

FIGS. 3a–3e illustrate steps (1) through (5) of a preferred method of forming the MOS device 10 of the present invention. It should be noted that the described process may be used for many different types of MOS devices. For example, the described process may be used to manufacture a PMOS or an NMOS device.

Figure 3A:
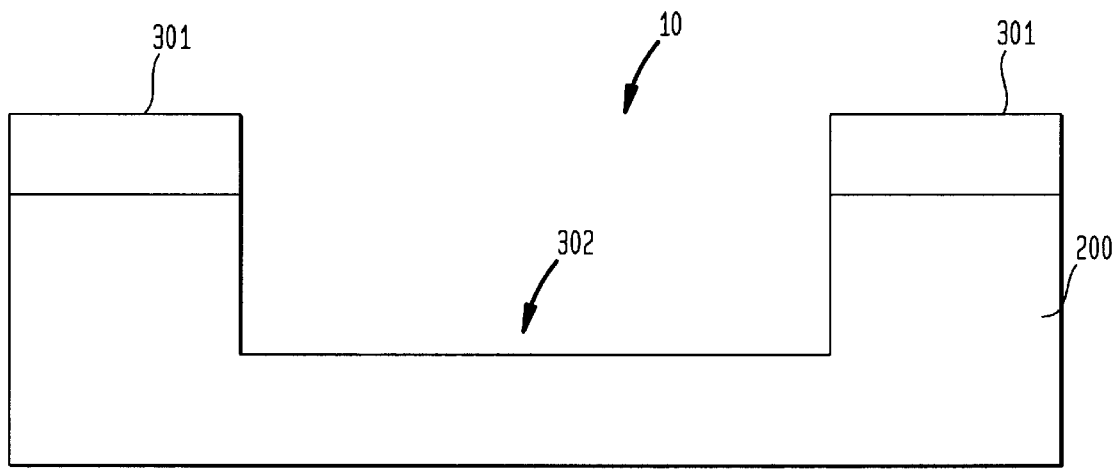
FIGS. 3a–3e are cross-sectional views illustrating manufacturing steps according to a preferred embodiment of the present invention.

The process steps (1) through (5) illustrated in FIGS. 3a–3e show views of an exemplary MOS device according to the present invention. The device of FIG. 3a has a substrate 200, having a first conductivity type. The gate trench 302 as shown in FIG. 3a is first etched in the substrate using a standard etching technique, such as Reactive Ion Etching (RIE). Preferably, the trench is etched to a depth of 0.5 μm–1 μm, and a width of 0.05 μm–10 μm. A photoresist or an isolation layer 301 such as oxide or nitride may be deposited over the source/drain sites in the gate trench 302. Subsequently, the isolation layer in the trench may be etched using an anisotropic etching technique.

Figure 3B:
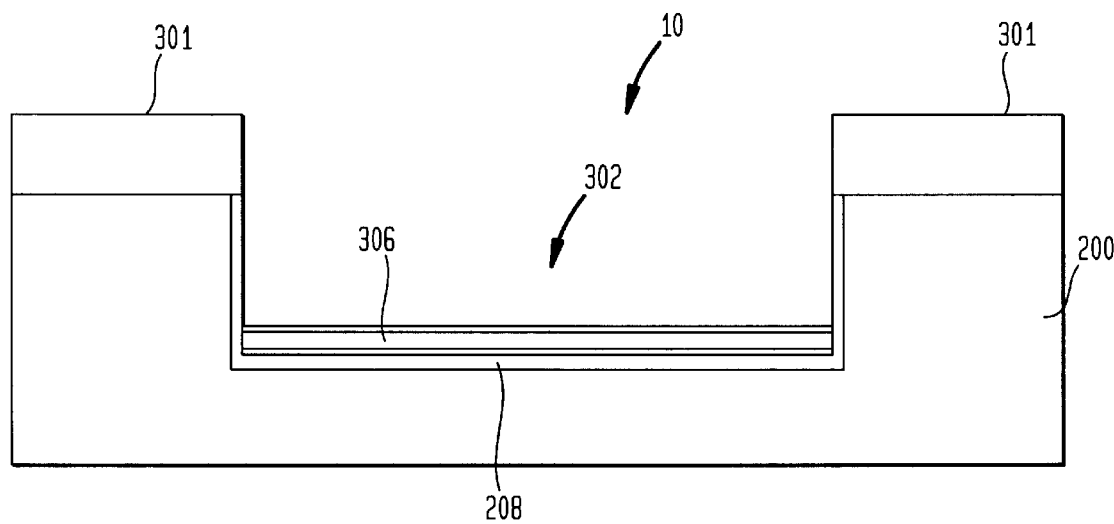

In step (2) shown in FIG. 3b, a thin gate oxide 208 is grown in the trench. This gate oxide is preferably grown to a thickness of 30 Å–500 Å, and is used to define the channel region. On top of the thin gate oxide 208, a thin polysilicon (poly) material 306 is deposited, preferably using the Low-Pressure Chemical Vapor Deposition (LPCVD) method. This is preferably deposited to a thickness of 200 Å–1000 Å. The thin poly material 306 is used to protect the grown oxide region accordingly, any suitable material may be substituted for the poly. Subsequently, the poly 306 (or other material) is etched back so that it covers only the bottom of the trench 302.

Figure 3C:
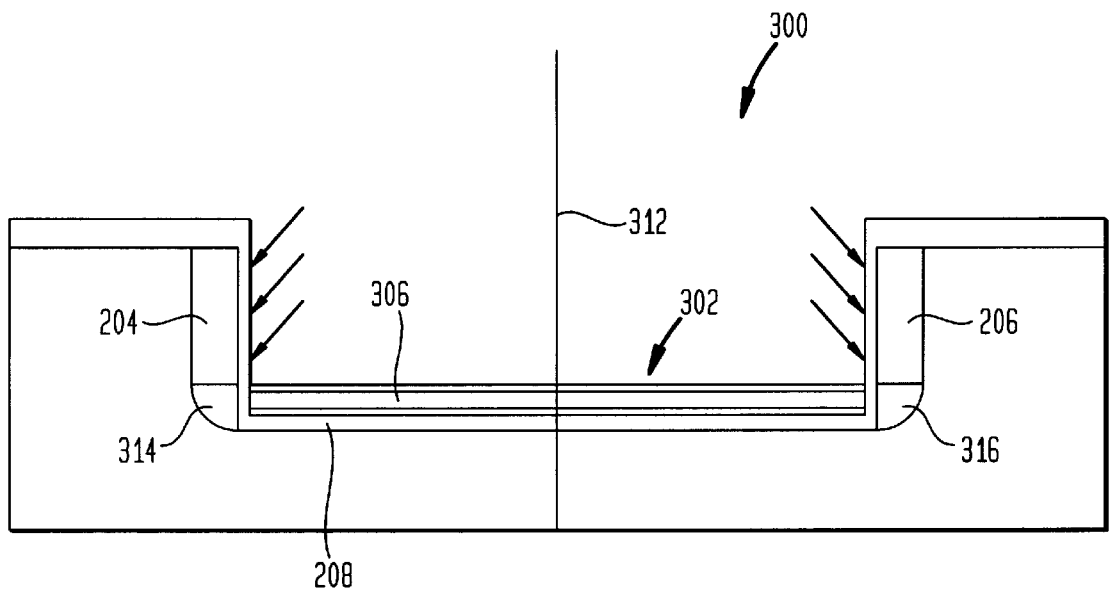

In step (3) shown in FIG. 3c, the source 204 and drain 206 are now formed. Preferably this is accomplished by implanting low energy ions of a second conductivity type opposite the first conductivity type, such as As or P, in the outside of the sidewalls of the trench 302, at an energy of 10–50 keV and a dose of $10^{15}$ cm$^{-2}$. The source and drain preferably have a width of approximately 200 Å–0.5 μm. The source 204 and drain 206 regions are vertically oriented and formed parallel to the sidewalls of the trench, thus greatly reducing the horizontal area occupied by the source and drain regions. The ions are preferably implanted at an angle, with respect to the normal vertical axis 312. Since the ions are implanted without the use of a photoresist technique, the size of the source and drain regions are not limited to the resolution of the photoresist technique. Thus, the source and drain regions may be formed at a suitably smaller cross section than previously possible.

Moreover, inherent in the formation of the source 204 and drain 206, lightly doped drain (LDD) regions 314, 316 of FIG. 3c are formed. This is due to the diffusion of ions at the lower end of source 204 and drain 206.

Figure 3D:
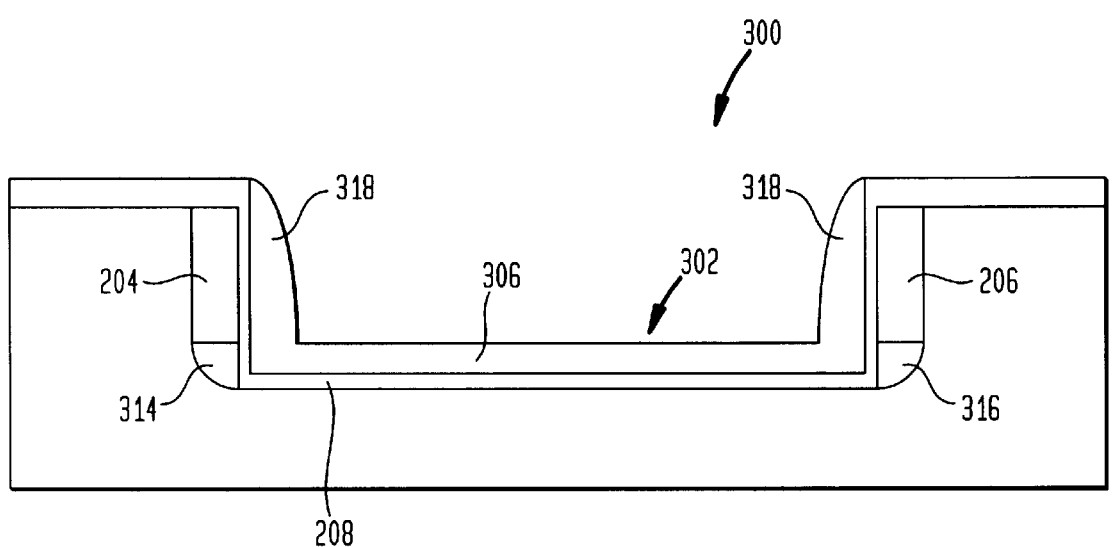

In step (4) shown in FIG. 3(d), a sidewall layer 318 is deposited on top of the thin poly 306, preferably using the LPCVD deposition technique. The sidewall layer may be an oxide or a nitride, or any other suitable insulating layer. This insulating layer is deposited to a thickness of approximately 200 Å–0.5 μM. Subsequently, the sidewall layer 318 is etched using a suitable etching technique such that only the sidewalls of the gate trench are covered. This sidewall layer forms the isolation region between the gate and source 204 regions, and the gate and drain 206 regions.

Figure 3E:
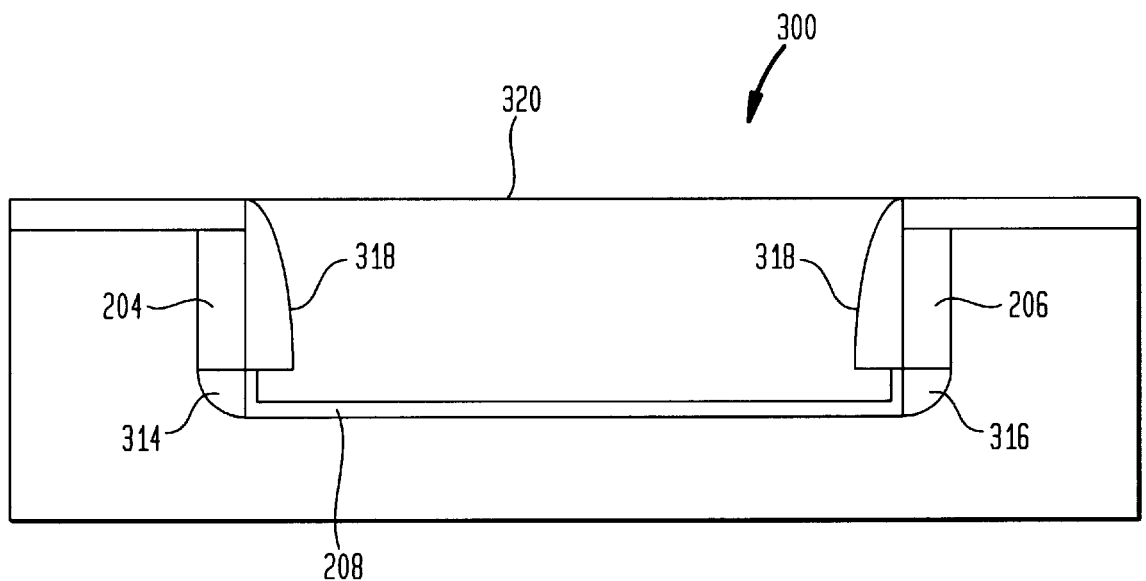

Finally, in step (5) as shown in FIG. 3(e), a gate material 320 is deposited in the trench. The gate material is preferably a polysilicon, and is deposited to fill the entire trench. The gate material 320 is then etched back using, for example, a dry etching technique, until it is approximately flush with the top of the trench. The gate material 320 is doped, preferably to the first conductivity type, with P ions to a concentration of $10^{20}$ cm$^{-3}$, at an energy of 50 keV. The MOS device may be completed using well-known backend processes which are not described herein.

Thus, a sidewall MOS device and process for its manufacture are disclosed. Since a photoresist is not used in forming the source and drain regions, the area consumed by these regions is not a function of the stepper device used to open a window in the substrate. This is accomplished by embedding the gate region in a trench in the substrate, and forming the source and drain regions in the sidewall of the trench. The source and drain regions therefore occupy less area than conventional source/drain regions. The isolation distance between adjacent devices on the substrate can be decreased, thus achieving a greater packing density. Additionally, there is no need to separately form a lightly doped drain (LDD) region in the present invention, since there is a vertical gradient concentration profile in the source and drain regions, as shown by 314, 316 of FIG. 3(*e*). Thus, an LDD structure is accomplished inherently in the present invention, without extra process steps. Moreover, by etching the gate material such that it is flush to the substrate, the MOS device of the present invention has the further advantage of being planar and substantially flat.

Finally, the above discussion was intended to be illustrative. Numerous alternative embodiments may be devised by those having ordinary skill in the art without departing from the spirit and scope of the following claims.

What is claimed is:

1. A MOS manufacturing process comprising the steps of:

forming a gate trench in a substrate, forming a channel horizontally on a bottom of said trench, forming source and drain regions vertically oriented and parallel to an outside sidewall of said trench by implanting ions at an angle, forming an isolation region on an inside sidewall of said trench, and forming a gate region in said trench.

2. The MOS manufacturing process of claim 1, wherein said gate trench is formed by depositing a photoresist layer over said source and drain regions, and anisotropically etching said trench.

3. The MOS manufacturing process of claim 2, wherein said step of forming said trench further comprises etching to a depth of approximately 0.5 $\mu$m to 1 $\mu$m and a width of approximately 0.5 $\mu$m to 10 $\mu$m.

4. The MOS manufacturing process of claim 1, wherein said channel is formed by depositing a gate oxide layer on the surface of said etched trench and substrate.

5. The MOS manufacturing process of claim 4, wherein said step of forming said channel further comprises depositing a gate oxide layer to a thickness of approximately 30 Å to 500 Å.

6. The MOS manufacturing process of claim 5, wherein said step of forming said channel further comprises depositing a polysilicon layer to a thickness of approximately 200 Å to 1000 Å on said gate oxide layer.

7. The MOS manufacturing process of claim 1, wherein said isolation regions are formed by depositing an insulating material, and etching said insulating material such that said insulating material covers the inner sidewalls of said trench.

8. The MOS manufacturing process of claim 7, wherein said step of forming isolation regions further comprises depositing an insulating material by a Low Pressure Chemical Vapor Deposition technique.

9. The MOS manufacturing process of claim 8, wherein said insulating material is one of oxide and nitride.

10. The MOS manufacturing process of claim 8, wherein said step of forming isolation regions further comprises depositing said insulating material to a thickness of approximately 200 Å to 0.5 $\mu$m.

11. The MOS manufacturing process of claim 1, wherein said gate region is formed by depositing a gate material to fill said trench and etching back said gate material such that said gate material is flush to said substrate.

12. The MOS manufacturing process of claim 11, wherein said step of forming gate regions further comprises doping said gate material with a first conductivity type to a concentration of $10^{20}$ cm$^{-3}$ at an energy of 50 keV.

13. The MOS manufacturing process of claim 1, further comprising the steps of:

depositing a gate oxide layer on said bottom and said inside sidewall of said trench, depositing a protective polysilicon layer in said trench, and using said protective polysilicon layer to protect said gate oxide layer at said bottom of said trench, forming said source and drain regions above said protective polysilicon layer.

14. The MOS manufacturing process of claim 13, wherein said step of forming said source and drain regions further comprises implanting ions through said gate oxide layer on portions of said inside sidewall of said trench not protected by said protective polysilicon layer.

15. The MOS manufacturing process of claim 13, further comprising inherently forming Lightly Doped Drain regions during said step of ion implantation forming said source and drain regions.

16. The MOS manufacturing process of claim 1, wherein said step of implanting ions is perfomred at an energy of 10 to 50 keV and a dose of $10^{15}$ cm$^{-2}$.

17. The MOS manufacturing process of claim 16, wherein said implanted ions comprise one of As and P.

18. The MOS manufacturing process of claim 1, wherein sad step of forming said source and drain regions further comprises forming source and drain regions having a width of approximately 200 Å to 0.5 $\mu$m.

* * * * *